United States Patent
Kim et al.

(10) Patent No.: US 9,054,708 B2
(45) Date of Patent: Jun. 9, 2015

(54) TOUCH SENSOR AND TOUCH PANEL INCLUDING THE SAME

(71) Applicant: Samsung Electronics Co., Ltd., Suwon-Si, Gyeonggi-Do (KR)

(72) Inventors: Sang-wook Kim, Yongin-si (KR); Seong-jun Park, Seoul (KR); David Seo, Yongin-si (KR); Young-jun Yun, Seongnam-si (KR); Yung-hee Yvette Lee, Seongnam-si (KR); Chang-seung Lee, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 155 days.

(21) Appl. No.: 13/737,450

(22) Filed: Jan. 9, 2013

(65) Prior Publication Data

US 2013/0176072 A1    Jul. 11, 2013

(30) Foreign Application Priority Data

Jan. 10, 2012  (KR) .......................... 10-2012-0003080

(51) Int. Cl.
*G06F 3/041* (2006.01)
*H03K 17/96* (2006.01)
*B82Y 15/00* (2011.01)

(52) U.S. Cl.
CPC ................. *H03K 17/96* (2013.01); *B82Y 15/00* (2013.01); *H03K 17/962* (2013.01)

(58) Field of Classification Search
CPC .................................. G06F 3/041; G06F 3/044
USPC ..................... 345/173–179; 178/18.01–18.09; 257/38, 39
See application file for complete search history.

(56) References Cited

U.S. PATENT DOCUMENTS

| | | | |
|---|---|---|---|
| 2008/0290941 A1* | 11/2008 | Ludwig .......................... 330/253 |
| 2009/0115741 A1* | 5/2009 | Wang et al. ..................... 345/173 |
| 2009/0273572 A1* | 11/2009 | Edwards et al. ............... 345/173 |
| 2010/0066703 A1* | 3/2010 | Chen et al. ..................... 345/175 |
| 2010/0173134 A1 | 7/2010 | Khokhlov et al. |
| 2011/0155478 A1 | 6/2011 | Choi et al. |

* cited by examiner

*Primary Examiner* — Premal Patel
(74) *Attorney, Agent, or Firm* — Harness, Dickey & Pierce, P.L.C.

(57) ABSTRACT

A touch sensor using a graphene diode and/or a touch panel including the touch sensor. The touch sensor includes a first sensing electrode configured to sense a touch; a first output line configured to transmit an electrical signal; and a first diode device including a first control terminal connected to the first sensing electrode, a first anode terminal connected to a voltage application unit, and a first cathode terminal connected to the first output line.

20 Claims, 7 Drawing Sheets

TOUCH SENSOR AND TOUCH PANEL INCLUDING THE SAME

CROSS-REFERENCE TO RELATED APPLICATIONS

This application claims the benefit of Korean Patent Application No. 10-2012-0003080, filed on Jan. 10, 2012, in the Korean Intellectual Property Office, the disclosure of which is incorporated herein in its entirety by reference.

BACKGROUND

1. Field

The present disclosure relates to touch sensors and touch panels, and more particularly, to touch sensors using graphene, and/or touch panels including the touch sensors.

2. Description of the Related Art

Graphene is a compound in which carbon atoms are combined in a hexagonal shape, and is a new and next-generation material for replacing basic electronic materials. Since electrons may freely move in graphene 100 or more times faster in comparison to silicon, graphene is regarded as a material capable of greatly increasing a data processing speed that has reached its limits in relation to silicon.

SUMMARY

Provided are touch sensors using a graphene diode, and/or touch panels including the touch sensors.

Additional aspects will be set forth in part in the description which follows and, in part, will be apparent from the description, or may be learned by practice of the presented example embodiments.

According to an example embodiment, a touch sensor for transforming a touch of a user into an electrical signal includes a first sensing electrode configured to sense the touch; a first output line configured to transmit the electrical signal; and a first diode device including a first control terminal connected to the first sensing electrode, a first anode terminal connected to a voltage application unit, and a first cathode terminal connected to the first output line.

Due to the touch, a voltage of the first sensing electrode may be increased or decreased and thus the first diode device may be turned on or off, and the electrical signal may be generated by the turned-on or turned-off first diode device.

The touch sensor may further include a capacitive device connected to the first diode device; and a switching device connected between the capacitive device and the first output line.

The capacitive device may store the electrical signal generated by the first diode device, and the switching device may transmit the electrical signal stored in the capacitive device to the first output line in response to a scan signal.

The switching device may include a transistor device. In this case, the transistor device may include a gate terminal configured to receive the scan signal, a first source or drain terminal connected to the first cathode terminal of the first diode, and a second source or drain terminal connected to the first output line.

The switching device may include a third diode device. In this case, the third diode device may include a third control terminal configured to receive the scan signal, a third anode terminal connected to the first cathode terminal of the first diode, and a third cathode terminal connected to the first output line.

According to another example embodiment, a touch panel includes a substrate; a first touch sensor on the substrate configured to transform a first touch of a user into a first electrical signal; and a second touch sensor on the substrate configured to transform a second touch of the user into a second electrical signal, wherein the first touch sensor includes a first sensing electrode configured to sense the first touch; a first output line configured to transmit the first electrical signal; and a first diode device including a first control terminal connected to the first sensing electrode, a first anode terminal connected to a voltage application unit, and a first cathode terminal connected to the first output line, and wherein the second touch sensor includes a second sensing electrode configured to sense the second touch; a second output line configured to transmit the second electrical signal; and a second diode device including a second control terminal connected to the second sensing electrode, a second anode terminal connected to a voltage application unit, and a second cathode terminal connected to the second output line.

The substrate may include at least one of a silicon substrate, a glass substrate, and a flexible substrate.

The first and second output lines may be parallel to each other.

The touch panel may further include a first control line connected to the first and second control terminals and non-parallel to the first and second output lines.

The touch panel may further include a first capacitive device connected to the first diode device; a second capacitive device connected to the second diode device; a first switching device connected between the first capacitive device and the first output line; and a second switching device connected between the second capacitive device and the second output line.

The first capacitive device may be configured to store the first electrical signal generated by the first diode device, the first switching device may be configured to transmit the first electrical signal stored in the first capacitive device to the first output line in response to a scan signal, the second capacitive device may be configured to store the second electrical signal generated by the second diode device, and the second switching device may be configured to transmit the second electrical signal stored in the second capacitive device to the second output line in response to the scan signal.

The touch panel may further include a scan line configured to transmit the scan signal to the first and second switching devices. In this case, the scan line may be non-parallel to the first and second output lines.

According to another example embodiment, a touch sensor for transforming a touch of a user into an electrical signal includes a first sensing electrode configured to sense the touch; a first output line configured to transmit the electrical signal; and a first diode device configured to be turned on or off due to a voltage variation of the first sensing electrode and thus to generate an electrical signal corresponding to the touch.

Due to the touch, a voltage of the first sensing electrode may be increased or decreased and thus a built-in potential of the first diode device is changed, the first diode device of which the built-in potential is changed may be turned on or off, and the electrical signal corresponding to the touch may be generated by the turned-on or turned-off first diode device.

BRIEF DESCRIPTION OF THE DRAWINGS

These and/or other aspects will become apparent and more readily appreciated from the following description of the example embodiments, taken in conjunction with the accompanying drawings of which.

Figure 1:
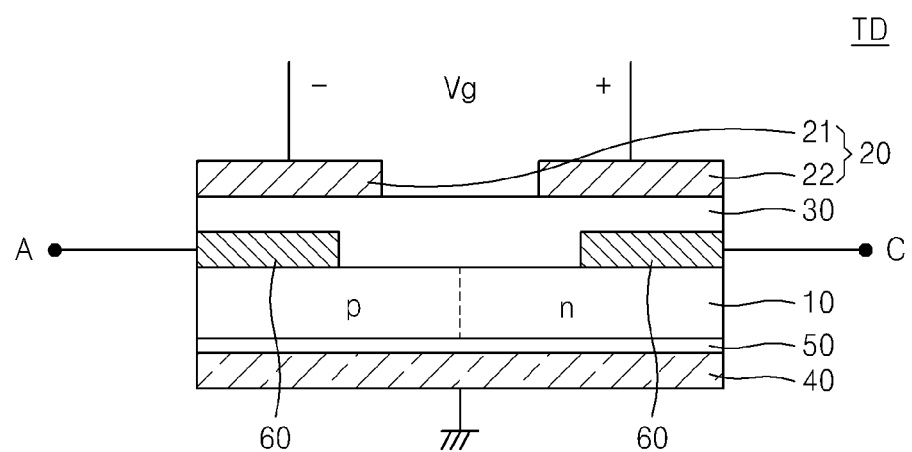
FIG. 1 is a cross-sectional view of a diode device according to an example embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
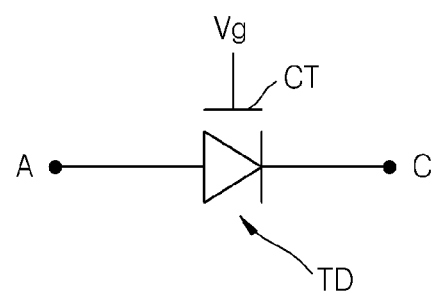
FIG. 2 is a circuit diagram of the diode device illustrated in FIG. 1.

FIG. 1 is a cross-sectional view of a diode device TD according to an example embodiment. FIG. 2 is a circuit diagram of the diode device TD illustrated in FIG. 1.

Referring to FIG. 1, the diode device TD may include a graphene layer 10, an upper gate electrode 20, an upper insulating layer 30, a lower gate electrode 40, a lower insulating layer 50, and anode and cathode electrodes 60.

The graphene layer 10 may include one or more layers formed of carbon atoms. A current may flow through the graphene layer 10 and may be generated based on one of two types of charge carriers (i.e. electrons and holes). The current that flows through the graphene layer 10 may be controlled by a control voltage Vg of the upper gate electrode 20 and/or the lower gate electrode 40.

The upper gate electrode 20 may be formed on an upper surface of the graphene layer 10, and the lower gate electrode 40 may be formed on a lower surface of the graphene layer 10. The upper insulating layer 30 may be formed between the upper gate electrode 20 and the anode and cathode electrodes 60, and between the upper gate electrode 20 and the graphene layer 10. The lower insulating layer 50 may be formed between the lower gate electrode 40 and the graphene layer 10.

The upper gate electrode 20 may include a first electrode 21 formed on a first region p of the graphene layer 10, and a second electrode 22 formed on a second region n of the graphene layer 10. The upper gate electrode 20 is a control terminal CT (see FIG. 2) of the diode device TD, and characteristics of the diode device TD may be changed due to the control voltage Vg from the upper gate electrode 20.

The control voltage Vg, which is received due to the first and second electrodes 21 and 22 of the upper gate electrode 20, may change properties of the graphene layer 10. For example, if a low-level voltage is applied to the first electrode 21 and a high-level voltage is applied to the second electrode 22, the first region p of the graphene layer 10 is changed to a p-type graphene region and the second region n of the graphene layer 10 is changed to an n-type graphene region. Accordingly, the graphene layer 10 may form a p-n junction and thus may function as a p-n diode.

Otherwise, if a high-level voltage is applied to the first electrode 21 and a low-level voltage is applied to the second electrode 22, the first region p of the graphene layer 10 may be changed to an n-type graphene region and the second region n of the graphene layer 10 may be changed to a p-type graphene region.

Although the diode device TD may change its function according to a variation in the control voltage Vg as described above, in the current example embodiment, it is assumed that a low-level voltage is applied to the first electrode 21, a high-level voltage is applied to the second electrode 22, the lower gate electrode 40 is connected to a ground terminal, and thus the diode device TD functions as a p-n diode including an anode terminal A and a cathode terminal C. FIG. 2 is a circuit diagram of the diode device TD according to the above assumption.

Referring to FIG. 2, the diode device TD may include the control terminal CT, the anode terminal A, and the cathode terminal C. As described above, the function of the diode device TD may be changed according to whether the control voltage Vg applied to the control terminal CT is positive or negative. For example, a built-in potential of the diode device TD may be changed according to an absolute value of the control voltage Vg applied to the control terminal CT.

Figure 3:
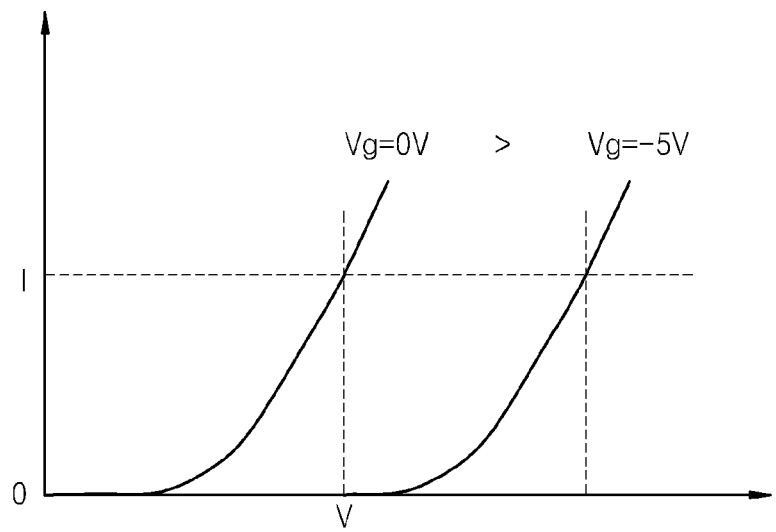
FIG. 3 is a graph showing current-voltage (I-V) curves according to a variation in a control voltage applied to a control terminal of the diode device illustrated in FIG. 2, according to an example embodiment.

FIG. 3 is a graph showing current-voltage (I-V) curves according to a variation in the control voltage Vg applied to the control terminal CT of the diode device TD illustrated in FIG. 2, according to an example embodiment.

Referring to FIGS. 2 and 3, if the control voltage Vg is 0V, a built-in potential of the diode device TD is 0V. Accordingly, if an operating voltage V of, for example, 5V is applied between the anode and cathode terminals A and C, an operating current I may flow through the diode device TD. Otherwise, if the control voltage Vg is −5V, since the built-in potential of the diode device TD is 5V, a voltage of at least 5V has to be applied between the anode and cathode terminals A and C in order to cope with an energy barrier in the diode device TD. In order to allow the operating current I to flow through the diode device TD, a voltage of 10V obtained by adding the operating voltage (i.e., 5V) to the built-in potential (i.e., 5V) has to be applied between the anode and cathode terminals A and C.

Consequently, if an operating voltage (e.g., 5V) is applied between the anode and cathode terminals A and C, the diode device TD illustrated in FIG. 2 may function as a tunable diode device that operates or does not operate according to a variation in the control voltage Vg, i.e., that is turned on or off according to the control voltage Vg.

Figure 4:
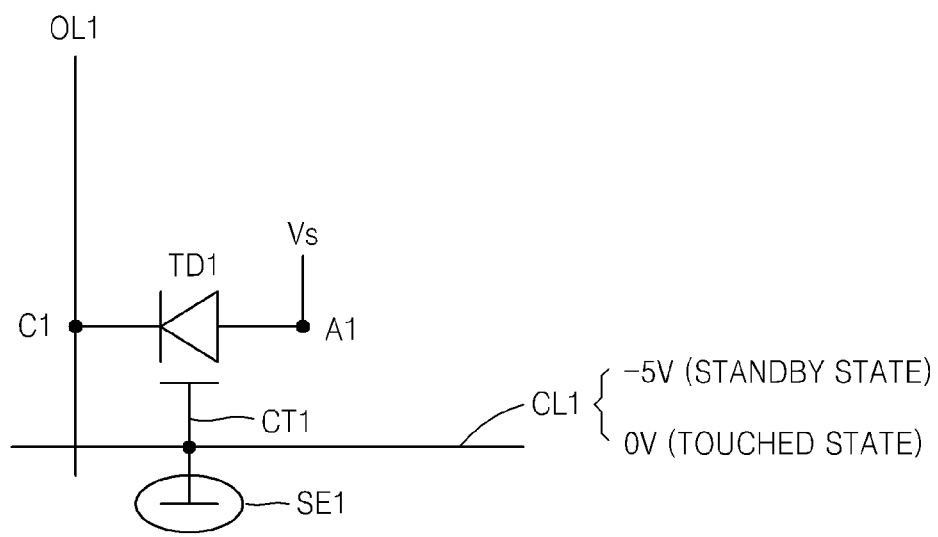
FIG. 4 is a circuit diagram of a touch sensor according to an example embodiment.

FIG. 4 is a circuit diagram of a touch sensor according to an example embodiment.

Referring to FIG. 4, the touch sensor may function to transform a user's touch into an electrical signal, and may include a first sensing electrode SE1, a first control line CL1, a first output line OL1, and a first diode device TD1.

The first sensing electrode SE1 may be provided to sense the user's touch. The first sensing electrode SE1 may be electrically connected to a first control terminal CT1 of the first diode device TD1. The first sensing electrode SE1 may be maintained in a standby state in which an arbitrary voltage (e.g., −5V) is applied via the first control line CL1. If a user inputs a touch by using, for example, a finger, since the user's finger is a conductor and functions as ground, the voltage of the first sensing electrode SE1 may be increased from −5V to 0V.

The first diode device TD1 may be turned on or off because its built-in potential is increased or decreased due to the user's touch. For example, the first diode device TD1 may be a tunable diode device described above in relation to FIG. 2, and may include the first control terminal CT1 connected to the first sensing electrode SE1, a first anode terminal A1 connected to a voltage application unit Vs, and a first cathode terminal C1 connected to the first output line OL1.

If the user's touch is input, the voltage of the first sensing electrode SE1 may be increased and thus the built-in potential of the first diode device TD1 may be changed. For example, if the first diode device TD1 has the characteristics shown in FIG. 3 and the first sensing electrode SE1 is maintained in a standby state in which a voltage of −5V is applied, since a voltage of −5V is applied to the first control terminal CT1 of the first diode device TD1, the built-in potential of the first diode device TD1 may be 5V. After that, if the user's touch is input and thus the voltage of the first sensing electrode SE1 is changed to 0V, since a voltage of 0V is applied to the first control terminal CT1 of the first diode device TD1, the built-in potential of the first diode device TD1 may be 0V.

The above-described variation in the built-in potential of the first diode device TD1 causes the first diode device TD1 to be turned on or off. For example, if a voltage of 5V is applied to the voltage application unit Vs connected to the first anode terminal A1 of the first diode device TD1 and a voltage of 0V is applied to the first output line OL1 connected to the first cathode terminal C1 of the first diode device TD1, a voltage difference between the first anode and cathode terminals A1 and C1 is 5V. If the voltage of the first sensing electrode SE1 is −5V (i.e., in the above standby state), the built-in potential of the first diode device TD1 is 5V. In this case, the first diode device TD1 may be turned off in spite of the voltage difference of 5V. Otherwise, if the voltage of the first sensing electrode SE1 is 0V (i.e., if the user's touch is input), the built-in potential of the first diode device TD1 may be 0V and thus the first diode device TD1 may be turned on due to the voltage difference of 5V. An electrical signal (e.g., a current) that flows through the turned-on first diode device TD1 may be transmitted to the first output line OL1.

According to the above-described touch sensor, due to a variation (increase or decrease) in the first sensing electrode SE1 according to a user's touch, the built-in potential of the first diode device TD1 is changed and thus the first diode device TD1 is turned on or off. As such, an electrical signal corresponding to the user's touch may be generated and transmitted to the first output line OL1.

Consequently, a touch sensor may be implemented by using a tunable diode including a graphene material. In this case, since an empty space in a hexagonal structure of the graphene material provides a buffering function, an impact-resistant touch sensor may be implemented. Since the touch sensor is very elastic and thus electrical conductivity is not affected even when it is bent or stretched, flexible electronics may be easily implemented. Also, a circuit using a graphene material may be used to implement transparent electronics.

Figure 5:
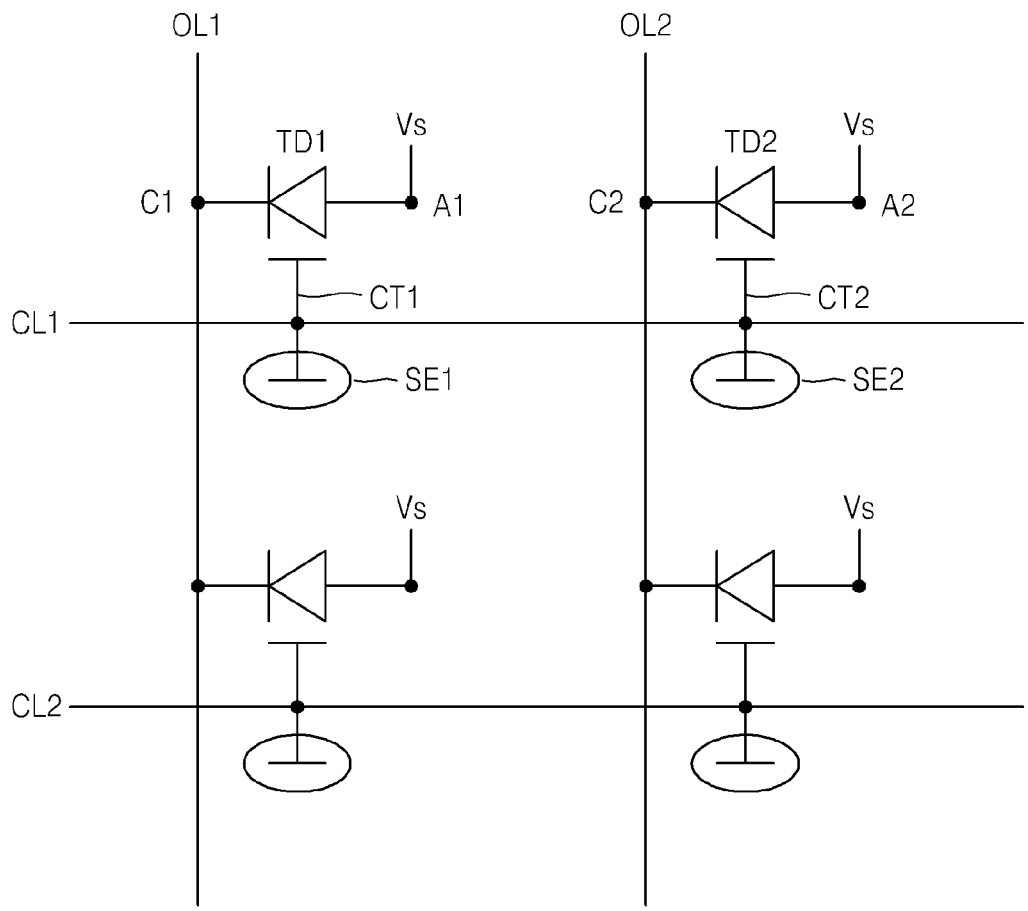
FIG. 5 is a circuit diagram of a touch panel according to an example embodiment.

FIG. 5 is a circuit diagram of a touch panel according to an example embodiment.

Referring to FIG. 5, the touch panel may include a plurality of touch sensors for transforming a user's touch into an electrical signal.

The touch sensors may be formed on a substrate (not shown) that may include at least one of a silicon substrate, a glass substrate, and a flexible substrate.

Each of the touch sensors may be implemented as the touch sensor illustrated in FIG. 4. For example, from among the touch sensors, a first touch sensor may include the first diode device TD1 including the first control terminal CT1 connected to the first sensing electrode SE1 and the first control line CL1, the first anode terminal A1 connected to the voltage application unit Vs, and the first cathode terminal C1 connected to the first output line OL1. From among the touch sensors, a second touch sensor may include a second diode device TD2 including a second control terminal CT2 connected to a second sensing electrode SE2, a second anode terminal A2 connected to a voltage application unit Vs, and a second cathode terminal C2 connected to a second output line OL2. Optionally, the first and second anode terminals A1 and A2 may be connected to the same voltage application unit Vs. Also, the first and second output lines OL1 and OL2 may be parallel to each other.

The first control line CL1 may be connected to the first and second control terminals CT1 and CT2, and may apply an arbitrary voltage (e.g., −5V) to the first and second control terminals CT1 and CT2 in a standby state of the first and second touch sensors. Although the first control line CL1 is connected to both the first and second control terminals CT1 and CT2 in FIG. 5, it should be noted that example embodiments are not limited thereto. For example, a control line connected to the first control terminal CT1 and a control line connected to the second control terminal CT2 may be electrically separate from each other.

Figure 6:
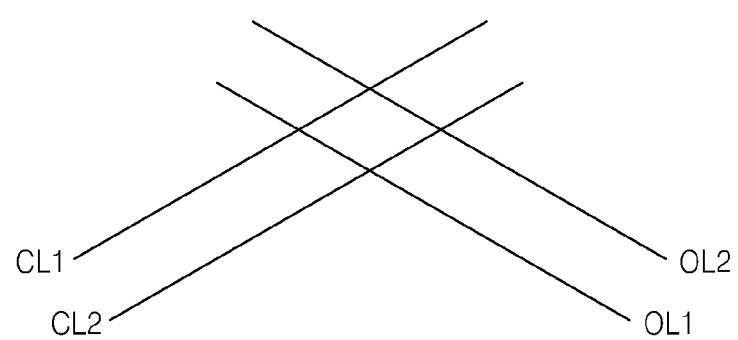
FIG. 6 is a schematic diagram showing alignment of a first output line, a second output line, a first control line, and a second control line of the touch panel illustrated in FIG. 5.

The first and second control lines CL1 and CL2 may be parallel to each other. Also, the first and second control lines CL1 and CL2 may be perpendicular to the first and second output lines OL1 and OL2 parallel to each other. A touch panel in which touch sensors are aligned in a matrix shape may be implemented and the position of a user's touch may be recognized in the form of a grid. Although the first and second control lines CL1 and CL2 are perpendicular to the first and second output lines OL1 and OL2 in FIG. 5, it should be noted that example embodiments are not limited thereto. As illustrated in FIG. 6, the first and second control lines CL1 and CL2 may be non-parallel to the first and second output lines OL1 and OL2 and thus a mesh-shaped touch panel may be implemented.

Figure 7:
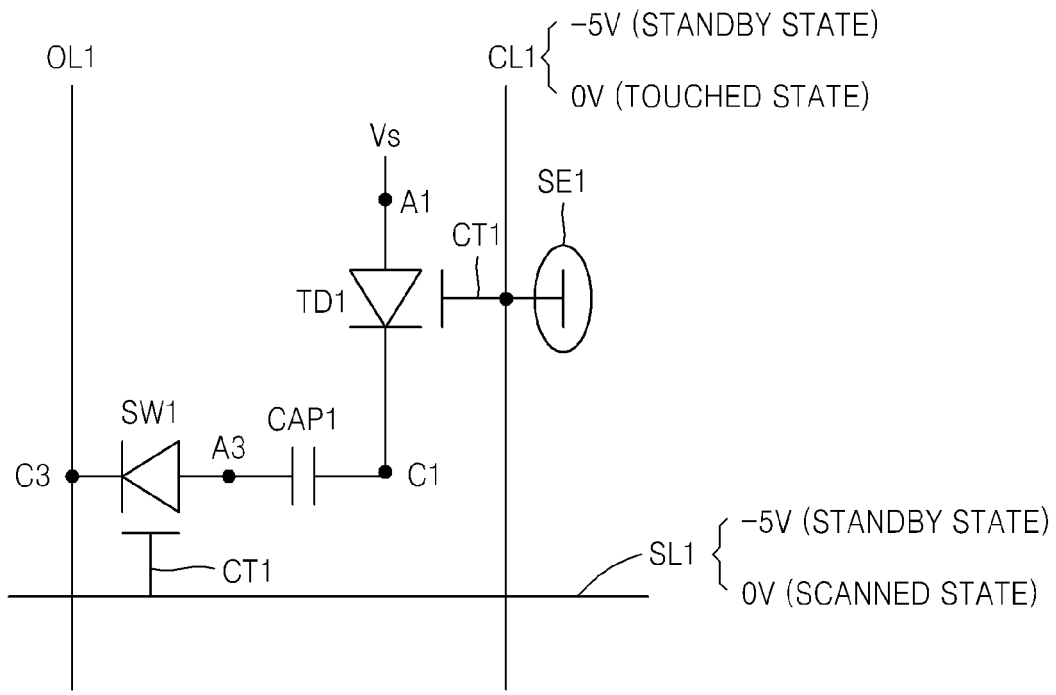
FIGS. 7 and 8 are circuit diagrams of touch sensors according to other example embodiments.

FIG. 7 is a circuit diagram of a touch sensor according to another example embodiment. The touch sensor according to the current example embodiment may be modified from the touch sensor illustrated in FIG. 4. Hereinafter, redundant descriptions will not be provided.

Referring to FIG. 7, the touch sensor may further include a first capacitive device CAP1, a first switching device SW1, and a first scan line SL1.

The first capacitive device CAP1 may be connected to the first diode device TD1 and thus may store an electrical signal generated by the first diode device TD1. For example, the first capacitive device CAP1 may be connected between the first cathode terminal C1 of the first diode device TD1 and a third anode terminal A3 of the first switching device SW1 implemented as a third diode device.

The first switching device SW1 may be connected between the first capacitive device CAP1 and the first output line OL1. The first switching device SW1 may be configured to transmit the electrical signal stored in the first capacitive device CAP1 to the first output line OL1 in response to a scan signal. The first switching device SW1 may be implemented as a third diode device. The third diode device may include a third control terminal CT3 connected to the first scan line SL1 to receive the scan signal, the third anode terminal A3 connected to the first capacitive device CAP1, and a third cathode terminal C3 connected to the first output line OL1.

As described above in relation to FIG. 4, if the user's touch is input, for example, the first diode device TD1 may be turned on and thus a current may flow through the first diode device TD1 An electrical signal generated by the first diode device TD1 may be stored in the first capacitive device CAP1. If a scan signal is transmitted to the third control terminal CT3 via the first scan line SL1, the first switching device SW1 implemented as the third diode device may be turned on and thus the electrical signal stored in the first capacitive device CAP1 may be transmitted to the first control line CL1.

Although the first switching device SW1 is implemented as the third diode device in FIG. 7, example embodiments are not limited thereto. For example, as illustrated in FIG. 8, a first switching device SW1' may be implemented as a transistor device The transistor device may include a gate terminal connected to the first scan line SL1 to receive the scan signal, a first source or drain terminal connected to the first capacitive device CAP1, and a second source or drain terminal connected to the first output line OL1.

Figure 9:
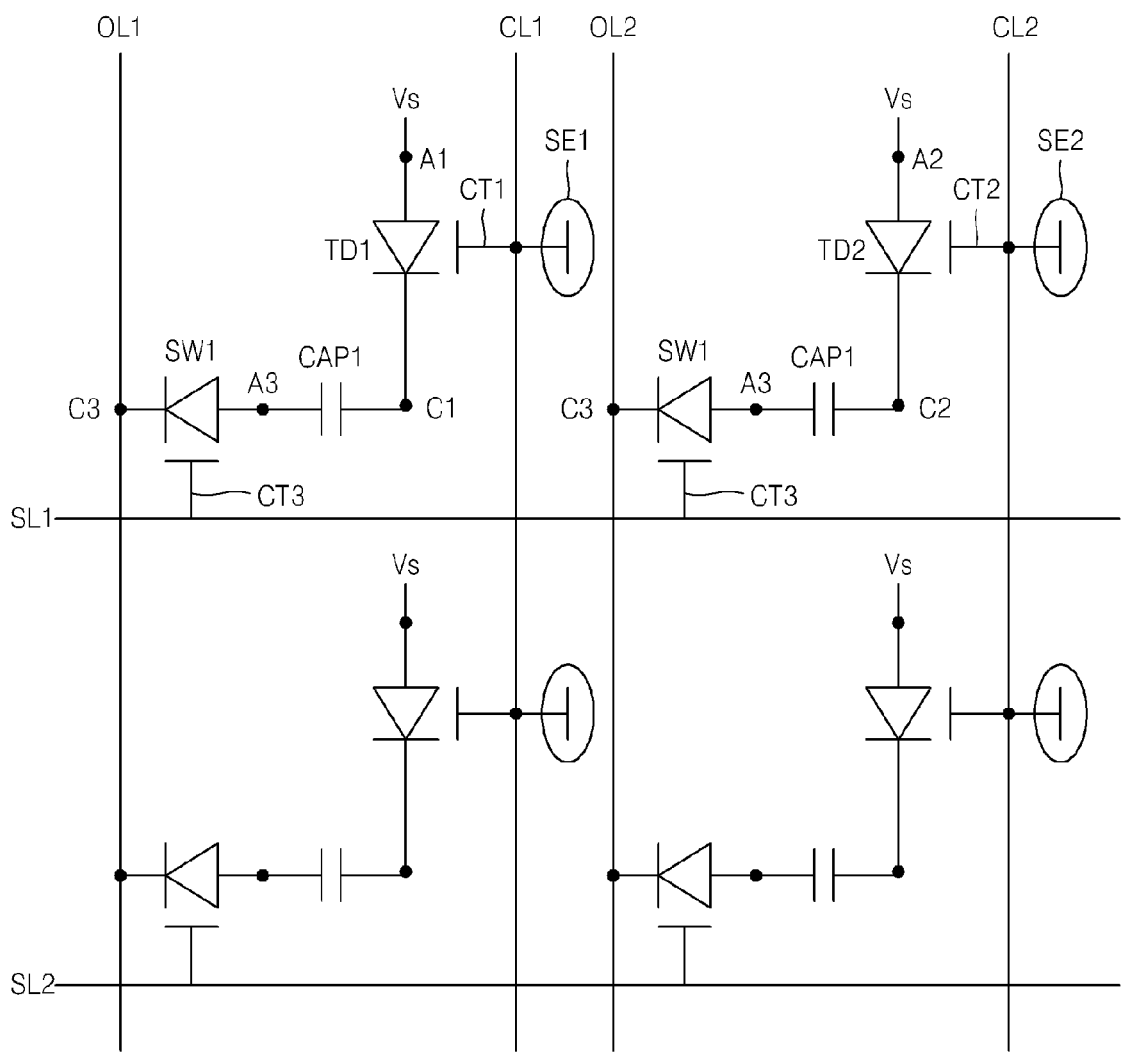
FIG. 9 is a circuit diagram of a touch panel according to another example embodiment.

FIG. 9 is a circuit diagram of a touch panel according to another example embodiment. The touch panel according to the current example embodiment may be modified from the touch panel illustrated in FIG. 5. Hereinafter, redundant descriptions will not be provided.

Referring to FIG. 9, the touch panel may include a plurality of touch sensors for transforming a user's touch into an electrical signal.

Figure 8:
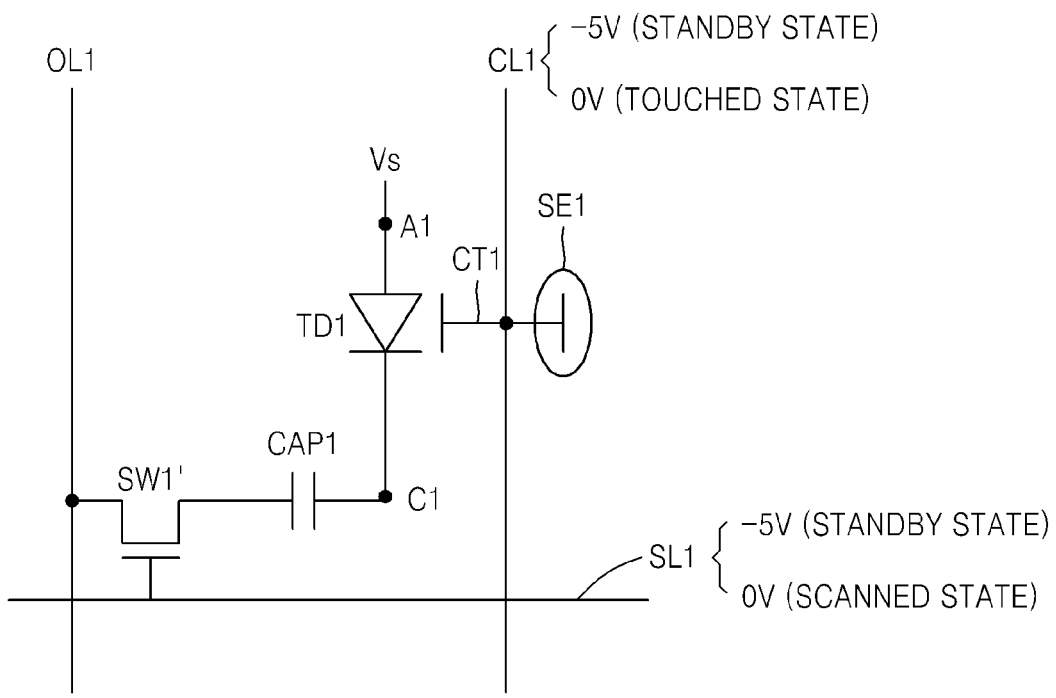

Each of the touch sensors may be implemented as the touch sensor illustrated in FIG. 8. For example, from among the touch sensors, a first touch sensor may include the first diode device TD1, the first capacitive device CAP1 for storing an electrical signal generated by the first diode device TD1, and the first switching device SW1 configured to transmit the electrical signal stored in the first capacitive device CAP1 to the first output line OL1 in response to a scan signal. From among the touch sensors, a second touch sensor may include the second diode device TD2, a second capacitive device CAP2 for storing an electrical signal generated by the second diode device TD2, and a second switching device SW2 configured to transmit the electrical signal stored in the second capacitive device CAP2 to the second output line OL2 in response to a scan signal.

The first and second output lines OL1 and OL2 may be parallel to each other. The first and second control lines CL1 and CL2 may be parallel to the first and second output lines OL1 and OL2. This alignment of the first and second control lines CL1 and CL2 may be different from the alignment shown in FIG. 5 (i.e., the alignment in which the first and second control lines CL1 and CL2 are non-parallel to the first and second output lines OL1 and OL2). First and second scan lines SL1 and SL2 may be non-parallel to the first and second output lines OL1 and OL2. However, the alignment of lines shown in FIG. 9 is merely an example and may be changed in various ways.

Figure 10:
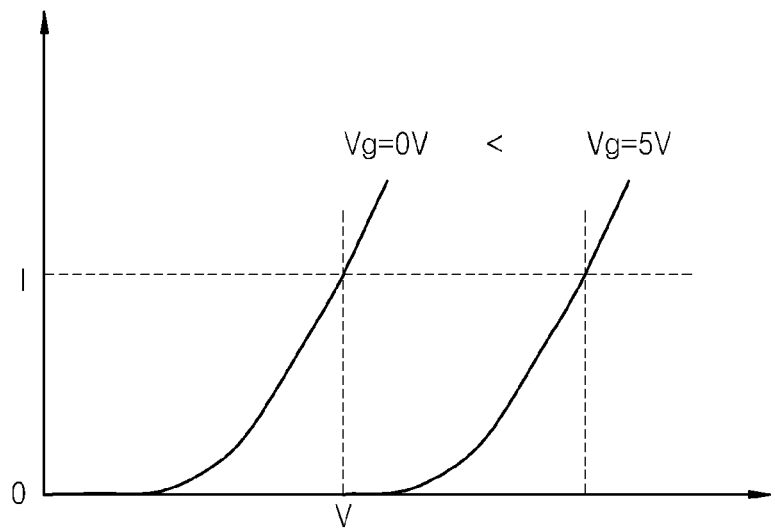
FIG. 10 is a graph showing I-V curves according to a variation in a control voltage applied to a control terminal of the diode device illustrated in FIG. 2, according to another example embodiment.

FIG. 10 is a graph showing I-V curves according to a variation in the control voltage Vg applied to the control terminal CT of the diode device TD illustrated in FIG. 2, according to another example embodiment.

Referring to FIGS. 2 and 10, if the control voltage Vg is 0V, a built-in potential of the diode device TD is 0V. Accordingly, if an operating voltage V of, for example, 5V is applied between the anode and cathode terminals A and C, an operating current I may flow through the diode device TD. Otherwise, if the control voltage Vg is 5V, since the built-in potential of the diode device TD is 5V, a voltage of at least 5V has to be applied between the anode and cathode terminals A and C in order to cope with an energy barrier in the diode device TD. In order to allow the operating current I to flow through the diode device TD, a voltage of 10V obtained by adding the operating voltage (i.e., 5V) to the built-in potential (i.e., 5V) has to be applied between the anode and cathode terminals A and C.

Figure 11:
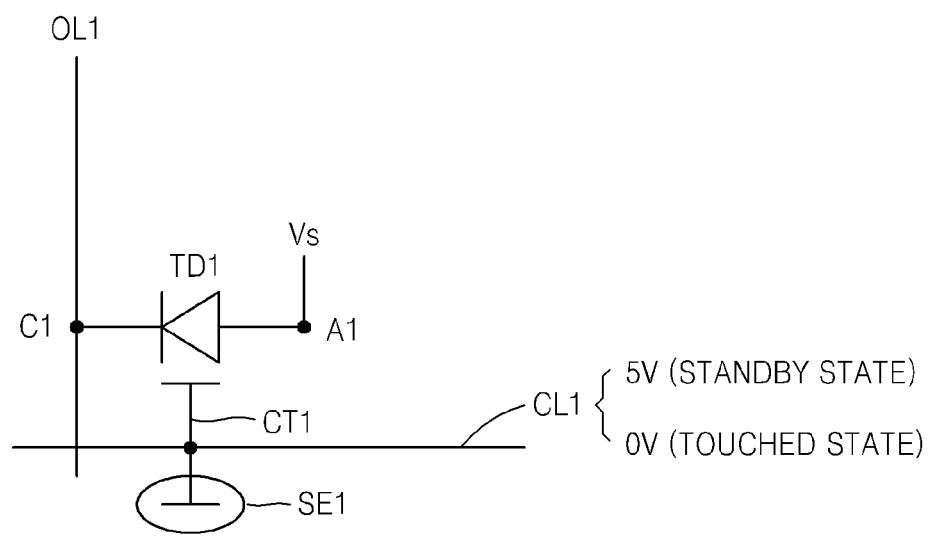
FIG. 11 is a circuit diagram of a touch sensor according to another example embodiment.

FIG. 11 is a circuit diagram of a touch sensor according to another example embodiment.

Referring to FIG. 11, the touch sensor may have the same structure as the touch sensor illustrated in FIG. 4. Accordingly, the touch sensor may include the first sensing electrode SE1, the first control line CL1, the first output line OL1, and the first diode device TD1. Hereinafter, redundant descriptions will not be provided.

The first sensing electrode SE1 may be maintained in a standby state in which an arbitrary voltage (e.g., 5V) is applied via the first control line CL1. If a user inputs a touch by using, for example, a finger, since the user's finger is a conductor and functions as ground, the voltage of the first sensing electrode SE1 may be decreased from 5V to 0V.

If the user's touch is input, the voltage of the first sensing electrode SE1 may be decreased and thus a built-in potential of the first diode device TD1 may be changed. For example, if the first diode device TD1 has the characteristics shown in FIG. 10 and the first sensing electrode SE1 is maintained in a standby state in which a voltage of 5V is applied, since a voltage of 5V is applied to the first control terminal CT1 of the first diode device TD1, the built-in potential of the first diode device TD1 may be 5V. If the user's touch is input and thus the voltage of the first sensing electrode SE1 is changed to 0V, since a voltage of 0V is applied to the first control terminal CT1 of the first diode device TD1, the built-in potential of the first diode device TD1 may be 0V.

The above-described variation in the built-in potential of the first diode device TD1 causes the first diode device TD1 to be turned on or off. For example, if a voltage of 5V is applied to the voltage application unit Vs connected to the first anode terminal A1 of the first diode device TD1 and a voltage of 0V is applied to the first output line OL1 connected to the first cathode terminal C1 of the first diode device TD1, a voltage difference between the first anode and cathode terminals A1 and C1 is 5V. If the voltage of the first sensing electrode SE1 is 5V (i.e., in the above standby state), the built-in potential of the first diode device TD1 is 5V. The first diode device TD1 may be turned off in spite of the voltage difference of 5V. If the voltage of the first sensing electrode SE1 is 0V (i.e., if the user's touch is input), the built-in potential of the first diode device TD1 may be 0V and thus the first diode device TD1 may be turned on due to the voltage difference of 5V. An electrical signal (e.g., a current) that flows through the turned-on first diode device TD1 may be transmitted to the first output line OL1. An electrical signal corresponding to the user's touch may be generated and transmitted to the first output line OL1.

Figure 12:
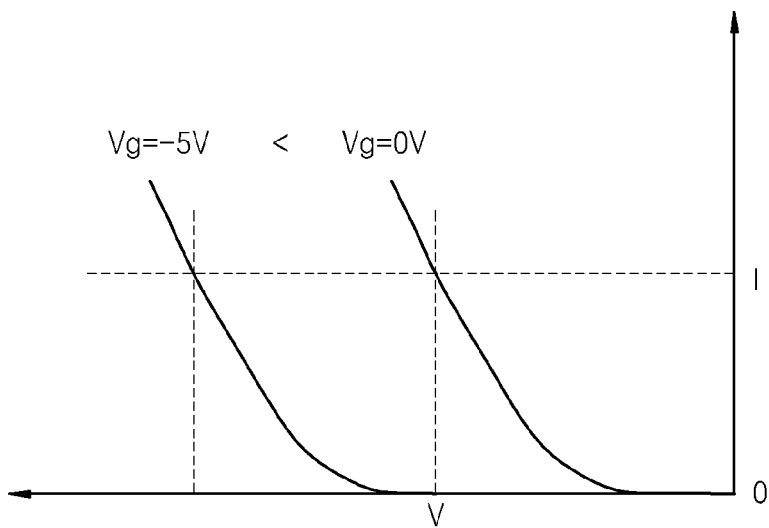
FIG. 12 is a graph showing I-V curves according to a variation in a control voltage applied to a control terminal of the diode device illustrated in FIG. 2, according to another example embodiment.

FIG. 12 is a graph showing I-V curves according to a variation in the control voltage Vg applied to the control terminal CT of the diode device TD illustrated in FIG. 2, according to another example embodiment.

Referring to FIGS. 2 and 12, the diode device TD may be a p-type graphene diode device and may have operating characteristics different from those of an n-type graphene diode device. For example, the diode device TD may have operating characteristics shown in FIG. 12 that differ from those of an n-type graphene diode shown in FIGS. 3 and 10.

If the control voltage Vg is 0V, a built-in potential of the diode device TD is 0V. If an operating voltage V of, for example, 5V is applied between the anode and cathode terminals A and C, an operating current I may flow through the diode device TD. If the control voltage Vg is −5V, since the built-in potential of the diode device TD is 5V, a voltage of at least 5V has to be applied between the anode and cathode terminals A and C in order to cope with an energy barrier in the diode device TD. In order to allow the operating current I to flow through the diode device TD, a voltage of 10V obtained by adding the operating voltage (i.e., 5V) to the built-in potential (i.e., 5V) has to be applied between the anode and cathode terminals A and C.

Figure 13:
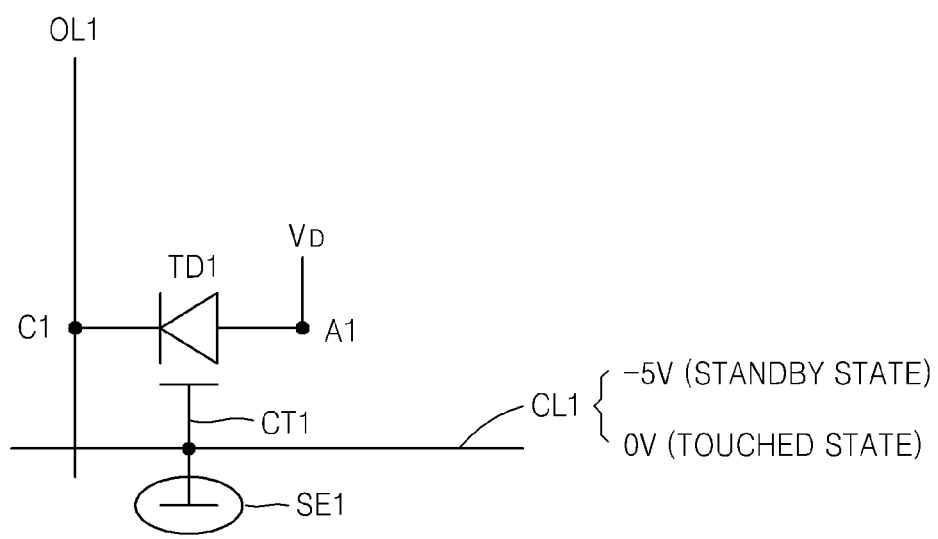
FIG. 13 is a circuit diagram of a touch sensor according to another example embodiment.

FIG. 13 is a circuit diagram of a touch sensor according to another example embodiment.

Referring to FIG. 13, the touch sensor may have the same structure as the touch sensor illustrated in FIG. 4. Accordingly, the touch sensor may include the first sensing electrode SE1, the first control line CL1, the first output line OL1, and the first diode device TD1. Hereinafter, redundant descriptions will not be provided.

The first sensing electrode SE1 may be maintained in a standby state in which an arbitrary voltage (e.g., −5V) is applied via the first control line CL1. If a user inputs a touch by using, for example, a finger, since the user's finger is a conductor and functions as ground, the voltage of the first sensing electrode SE1 may be increased from −5V to 0V.

If the user's touch is input, the voltage of the first sensing electrode SE1 may be increased and thus a built-in potential of the first diode device TD1 may be changed. For example, if the first diode device TD1 has the characteristics shown in FIG. 12 and the first sensing electrode SE1 is maintained in a standby state in which a voltage of −5V is applied, since a voltage of −5V is applied to the first control terminal CT1 of the first diode device TD1, the built-in potential of the first diode device TD1 may be 5V. If the user's touch is input and thus the voltage of the first sensing electrode SE1 is changed to 0V, since a voltage of 0V is applied to the first control terminal CT1 of the first diode device TD1, the built-in potential of the first diode device TD1 may be 0V.

The above-described variation in the built-in potential of the first diode device TD1 causes the first diode device TD1 to be turned on or off. For example, if a voltage of 5V is applied to a voltage application unit VD connected to the first anode terminal A1 of the first diode device TD1 and a voltage of 0V is applied to the first output line OL1 connected to the first cathode terminal C1 of the first diode device TD1, a voltage difference between the first anode and cathode terminals A1 and C1 is 5V. If the voltage of the first sensing electrode SE1 is −5V (i.e., in the above standby state), the built-in potential of the first diode device TD1 is 5V. The first diode device TD1 may be turned off in spite of the voltage difference of 5V. If the voltage of the first sensing electrode SE1 is 0V (i.e., if the user's touch is input), the built-in potential of the first diode device TD1 may be 0V and thus the first diode device TD1 may be turned on due to the voltage difference of 5V. An electrical signal (e.g., a current) that flows through the turned-on first diode device TD1 may be transmitted to the first output line OL1. As such, an electrical signal corresponding to the user's touch may be generated and transmitted to the first output line OL1.

As described above, according to one or more of the above example embodiments, a touch sensor may be implemented by using a tunable diode including a graphene material. In this case, since an empty space in a hexagonal structure of the graphene material provides a buffering function, an impact-resistant touch sensor may be implemented. Since the touch sensor is very elastic and thus electrical conductivity is not affected even when it is bent or stretched, flexible electronics may be easily implemented. Also, a circuit using a graphene material may be used to implement transparent electronics.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A touch sensor for transforming a touch of a user into an electrical signal, the touch sensor comprising:
    a first sensing electrode configured to sense the touch;
    a first output line configured to transmit the electrical signal; and
    a first diode device including a first control terminal connected to the first sensing electrode, a first anode terminal connected to a voltage application unit, and a first cathode terminal connected to the first output line,
    wherein the first sensing electrode is configured to increase or decrease a voltage based on the touch, the first diode device is configured to turn on or off based on the voltage and the electrical signal is generated by the turned-on or turned-off first diode device.

2. The touch sensor of claim 1, further comprising:
    a capacitive device connected to the first diode device; and
    a switching device connected between the capacitive device and the first output line.

3. The touch sensor of claim 2, wherein the capacitive device is configured to store the electrical signal generated by the first diode device, and
    wherein the switching device is configured to transmit the electrical signal stored in the capacitive device to the first output line in response to a scan signal.

4. The touch sensor of claim 2, wherein the switching device includes a transistor device.

5. The touch sensor of claim 4, wherein the transistor device includes a gate terminal configured to receive the scan signal, a first source or drain terminal connected to the first cathode terminal of the first diode, and a second source or drain terminal connected to the first output line.

6. The touch sensor of claim 2, wherein the switching device includes a third diode device.

7. The touch sensor of claim 6, wherein the third diode device includes a third control terminal configured to receive the scan signal, a third anode terminal connected to the first cathode terminal of the first diode, and a third cathode terminal connected to the first output line.

8. The touch sensor of claim 1, wherein the first diode device includes a graphene material.

9. A touch panel comprising:
    a substrate;
    a first touch sensor on the substrate configured to transform a first touch of a user into a first electrical signal;
    a second touch sensor on the substrate configured to transform a second touch of the user into a second electrical signal,
    wherein the first touch sensor includes,
        a first sensing electrode configured to sense the first touch,
        a first output line configured to transmit the first electrical signal, and
        a first diode device including a first control terminal connected to the first sensing electrode, a first anode terminal connected to a voltage application unit, and a first cathode terminal connected to the first output line, and
    wherein the second touch sensor includes,
        a second sensing electrode configured to sense the second touch,
        a second output line configured to transmit the second electrical signal, and
        a second diode device including a second control terminal connected to the second sensing electrode, a second anode terminal connected to the voltage application unit, and a second cathode terminal connected to the second output line;
    a first capacitive device connected to the first diode device;
    a second capacitive device connected to the second diode device;
    a first switching device connected between the first capacitive device and the first output line; and
    a second switching device connected between the second capacitive device and the second output line.

10. The touch panel of claim 9, wherein the substrate includes at least one of a silicon substrate, a glass substrate, and a flexible substrate.

11. The touch panel of claim 9, wherein the first and second output lines are parallel to each other.

12. The touch panel of claim 11, further comprising:
    a first control line connected to the first and second control terminals and non-parallel to the first and second output lines.

13. The touch panel of claim 9, wherein the first capacitive device is configured to store the first electrical signal generated by the first diode device,
    wherein the first switching device is configured to transmit the first electrical signal stored in the first capacitive device to the first output line in response to a scan signal,
    wherein the second capacitive device is configured to store the second electrical signal generated by the second diode device, and
    wherein the second switching device is configured to transmit the second electrical signal stored in the second capacitive device to the second output line in response to the scan signal.

14. The touch panel of claim 13, further comprising:
    a scan line configured to transmit the scan signal to the first and second switching devices.

15. The touch panel of claim 14, wherein the scan line is non-parallel to the first and second output lines.

16. The touch panel of claim 9, wherein the first diode device and the second diode device include a graphene material.

17. A touch sensor for transforming a touch of a user into an electrical signal, the touch sensor comprising:
- a first sensing electrode configured to sense the touch;
- a first output line configured to transmit the electrical signal; and
- a first diode device configured to be turned on or off due to a voltage variation of the first sensing electrode and thus to generate an electrical signal corresponding to the touch, wherein
    - the first sensing electrode is configured to increase or decrease a voltage based on the touch, the voltage changing a built-in potential of the first diode device,
    - the first diode device is configured to turn on or off based on the built-in potential of the first diode device, and
    - the electrical signal corresponding to the touch is generated by the turned-on or turned-off first diode device.

18. The touch sensor of claim 17, wherein the first diode device includes a graphene material.

19. A touch sensor for transforming a touch of a user into an electrical signal, the touch sensor comprising:
- a diode device including a graphene material, the diode device configured to have a tunable built-in potential, wherein the first diode device includes a first control terminal connected to the first sensing electrode, the first sensing electrode is configured to increase or decrease a voltage based on the touch, and the diode device is configured to tune a built-in potential based on the voltage and to turn on or off based on the built-in potential.

20. The touch sensor of claim 19, further comprising:
- a first sensing electrode configured to sense the touch.

* * * * *